United States Patent
Peng

(10) Patent No.: US 11,721,585 B2
(45) Date of Patent: Aug. 8, 2023

(54) METHOD FOR FABRICATING SEMICONDUCTOR MEMORY AND THE SEMICONDUCTOR MEMORY

(71) Applicant: Jack Zezhong Peng, San Jose, CA (US)

(72) Inventor: Jack Zezhong Peng, San Jose, CA (US)

(*) Notice: Subject to any disclaimer, the term of this patent is extended or adjusted under 35 U.S.C. 154(b) by 0 days.

(21) Appl. No.: 17/391,399

(22) Filed: Aug. 2, 2021

(65) Prior Publication Data
US 2022/0037207 A1    Feb. 3, 2022

(51) Int. Cl.
  *H01L 21/78*   (2006.01)
  *H01L 21/50*   (2006.01)
  *H01L 25/065*  (2023.01)
  *H01L 25/00*   (2006.01)

(52) U.S. Cl.
  CPC .............. *H01L 21/78* (2013.01); *H01L 21/50* (2013.01); *H01L 25/0655* (2013.01); *H01L 25/50* (2013.01)

(58) Field of Classification Search
  None
  See application file for complete search history.

(56) References Cited

U.S. PATENT DOCUMENTS

| | | | | |
|---|---|---|---|---|
| 3,999,105 | A  * | 12/1976 | Archey ................. | H01L 23/427 257/E23.172 |
| 4,303,993 | A  * | 12/1981 | Panepinto, Jr. ..... | G06F 12/0669 711/E12.087 |
| 5,014,235 | A  * | 5/1991 | Morton .................. | G06F 17/16 365/185.11 |
| 8,716,876 | B1 * | 5/2014 | Smolen ................... | H01L 24/06 438/109 |

(Continued)

FOREIGN PATENT DOCUMENTS

| CN | 109542836 | A | * | 3/2019 |
|---|---|---|---|---|
| CN | 110491785 | A | * | 11/2019 |

(Continued)

*Primary Examiner* — Michael Lebentritt

(57) ABSTRACT

A semiconductor memory fabrication method and the semiconductor memory are involved in semiconductors production and fabrication processes. The semiconductor memory manufacturing method of the present invention includes the following steps: 1) Using a semiconductor integrated circuit manufacturing process, a basic memory module array being fabricated on a wafer where the basic memory modules have IO circuit interfaces; 2) Dicing the wafer to obtain memory chips; 3) Packaging the separated memory chip. In step 1), the IO circuit interfaces of the basic memory modules adjacent in the orthogonal directions are connected by interconnection lines; and according to the predetermined memory capacity, step 2) is to determine the number of basic memory modules contained in the chip and the position of the edge line of the memory chip so that the interconnections across the edge line are cut off so to separate the entire (Continued)

memory chip from the wafer by dicing along the edge line of the memory chip. Using the technique of the present invention, memory chips of multiple different capacities can be produced with solely one set of masks or reticles, which greatly reduces the manufacture cost.

10 Claims, 5 Drawing Sheets

(56) References Cited

U.S. PATENT DOCUMENTS

| | | | | |
|---|---|---|---|---|
| 2003/0015792 | A1* | 1/2003 | Urakawa | G11C 5/04 257/E23.179 |
| 2010/0241788 | A1* | 9/2010 | Yeh | G06F 12/0246 710/52 |
| 2014/0317469 | A1* | 10/2014 | Sohn | G11C 29/42 714/764 |
| 2015/0162068 | A1* | 6/2015 | Woo | G11C 11/40615 365/222 |
| 2018/0350410 | A1* | 12/2018 | Curtis | G06F 9/5094 |

FOREIGN PATENT DOCUMENTS

| | | | | | |
|---|---|---|---|---|---|
| CN | 110688188 | A | * | 1/2020 | |
| JP | 4436582 | B2 | * | 3/2010 | G06K 19/07 |
| KR | 100843213 | B1 | * | 7/2008 | H01L 23/3128 |

* cited by examiner

METHOD FOR FABRICATING SEMICONDUCTOR MEMORY AND THE SEMICONDUCTOR MEMORY

FIELD

The present invention relates to semiconductor memory devices and process of manufacturing the same.

BACKGROUND OF THE INVENTION

Memory chip products of different capacities (such as 4 GB, 16 GB, and 256 GB) generally need to be implemented with different mask sets. For the processing technology of advanced memory (such as 3D multi-layer NAND or OTP memory), it is necessary to tackle the problem of high cost of mask sets. Usually, the price of a mask set is from several million dollars to tens of millions of dollars. Correspondingly, the cost of developing multiple memory products with different capacities is very high.

BRIEF SUMMARY OF THE INVENTION

The technical problem to be solved by the present invention is to provide a fabricating method which can produce semiconductor memories of different capacities with solely one mask or reticle set.

The technical solution adopted by the present invention is the manufacturing method for semiconductor memory which includes the following steps:
1) Using a semiconductor integrated circuit manufacturing process, a basic memory module array being fabricated on a wafer where the basic memory modules have IO circuit interfaces;
2) Dicing the wafer to obtain memory chips;
3) Packaging the separated memory chip;
wherein in step 1), the IO circuit interfaces of the basic memory modules adjacent in the orthogonal directions are connected via interconnection lines; and according to the predetermined memory capacity, step 2) is to determine the number of basic memory modules contained in the chip and the position of the edge line of the memory chip so that the interconnections across the edge line are cut off so to separate the entire memory chip from the wafer by dicing along the edge line of the memory chip.

It also includes the following step:
Writing identification information of memory unit, such as an address, to the storage area of each basic storage module.

In step 1), a switch is provided in the interconnection line; after step 1), the following step is also included: the on or off state of each switch is initialized according to the preset.

Step 2) further includes the following sub-step: setting the switch in each interconnection line at the edge line of the memory chip to off state.

The following step is further included: testing the basic memory modules within the edge line of the memory chip one by one, and for the abnormal basic memory module, cutting off its connection via interconnection lines to the normal basic memory modules.

The IO circuit interfaces include at least one of the following lines: data lines, control lines, and address lines.

The present invention also provides a semiconductor memory manufactured by using the foregoing fabricating method.

By adopting the technique of the present invention, solely one set of masks or reticles can be used to produce memory chips of multiple different capacities, which greatly reduces the manufacturing cost. The invention realizes the interconnection between the basic storage modules on the common wafer, with high transmission speed and high reliability.

DETAILED DESCRIPTION OF THE INVENTION

Figure 1:
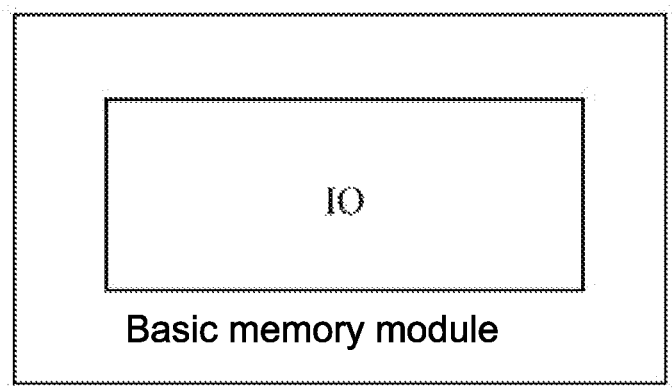
FIG. 1 is a schematic diagram of a prior art memory.

FIG. 1 shows a prior art memory, which includes a memory cell array composed of an IO circuit and a plurality of memory units. The IO circuit comprises functional modules such as address, data, clock, control, reading-writing, charge pump, power supply, etc., where the internal interface of the IO circuit is connected to the word line, bit line, and control line of the memory cell array. The present invention refers to the external interface of the IO circuit as the IO circuit interface, being used for external data transmission of the memory. In the prior art fabricating process, to manufacture the memory on the wafer, it is necessary to use masks or reticles to form the memory circuits and the IO circuits on the wafer. One mask set can only be applied to a specific capacity. For example, the mask used for manufacturing memories with capacity of 1G cannot be used for producing 8G memory.

The present invention provides a process for fabricating a bus-type memory, where one set of masks or reticles for memory chips with a basic capacity can be used to produce memory capacity at an integer multiple of the basic capacity. For example, if one reticle set can be used to produce a 4G memory with a memory unit of a minimal memory capacity of 1G, an integer number (say, 16) of the 1G memory units can be arrayed in a chip by repeatedly using the reticle for 4 times. The memory units with a specific structure (including interconnection lines) are periodically formed on the wafer. After dicing, packaging, and initialization, it becomes a semiconductor memory chip with a capacity of 1G, 4G, 8G or 16G.

Figure 2:
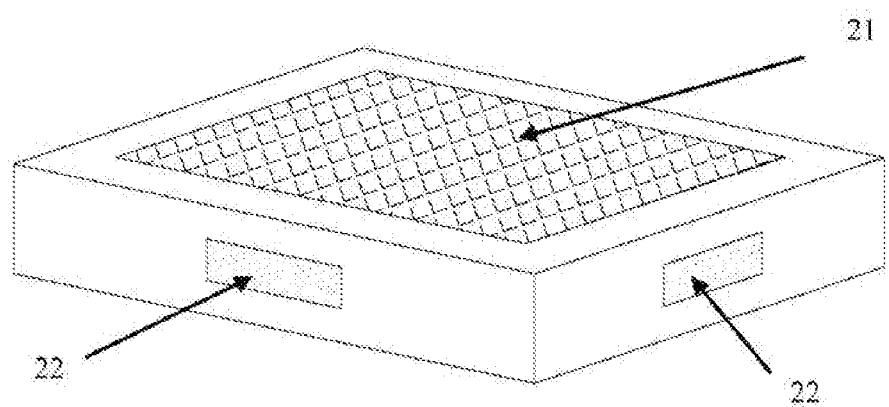
FIG. 2 is a three-dimensional schematic diagram of a basic storage module of the first embodiment.

The First Implementation Mode:

The three-dimensional schematic diagram of the basic storage module is shown in FIG. 2. 21 is the IO interface formed by multiple IO connections, and 22 is the area of interconnection lines. The cross section of the interconnection lines is shown.

Figure 3:
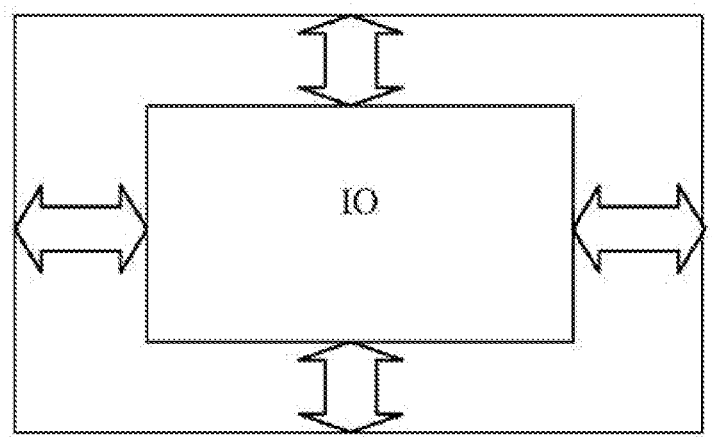
FIG. 3 is a schematic diagram of the basic storage module structure of the first embodiment.
Figure 4:
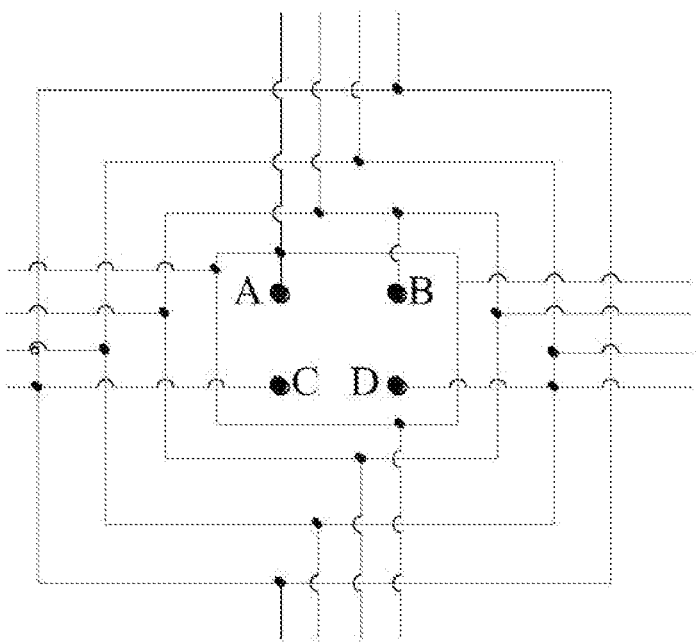
FIG. 4 is a schematic diagram of the connection relationship between the IO interface and the interconnection line in the first embodiment.

FIG. 3 shows the structure of a basic storage module of a minimal memory capacity, with arrows indicating interconnection lines, and the IO label in FIGS. 3 to 10 indicates an IO interface. FIG. 4 is a very simplified schematic diagram of a specific connection, showing a very simple IO interface with only the 4 IO contacts A, B, C and D (which can be circuit connection points similar to pins), and 4 ring-shaped connection lines surrounding the IO interface, are led out in 4 directions, respectively. The 4 sets of interconnection lines are in parallel connection. In the actual situation, the number of IO contacts is far more than 4, and FIG. 4 only uses the number of 4 as an illustration.

Figure 5:
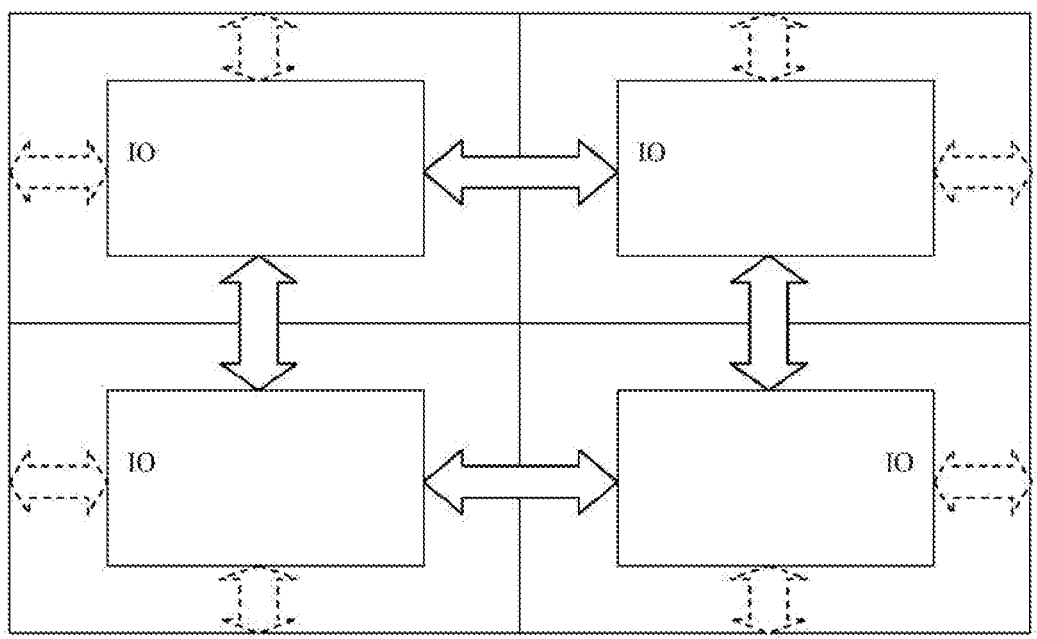
FIG. 5 is a schematic diagram of a 2×2 memory cell array according to the first embodiment.
Figure 6:
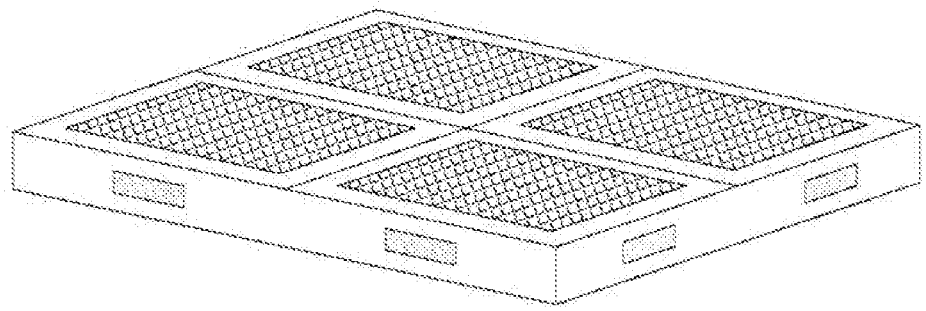
FIG. 6 is a three-dimensional schematic diagram of a 2×2 memory cell array according to the first embodiment.

FIG. 5 shows a 2×2 memory cell array. The interconnection lines at the edge line of the memory chip are cut off during dicing, and the dicing lines or scribe lines are shown by dashed arrows; the interconnection lines that are cut off are in a floating state. The remaining interconnections between the adjacent basic storage modules in the cell array are kept connected, shown in solid arrows, and the connections between each IO interface are formed in a bus-type interconnection architecture. FIG. 6 shows a three-dimensional schematic diagram of the memory array.

Figure 7:
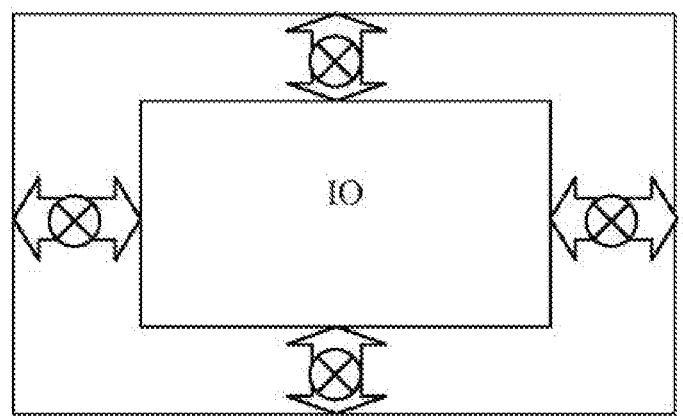
FIG. 7 is a schematic diagram of the basic storage module structure of the second embodiment.
Figure 8:
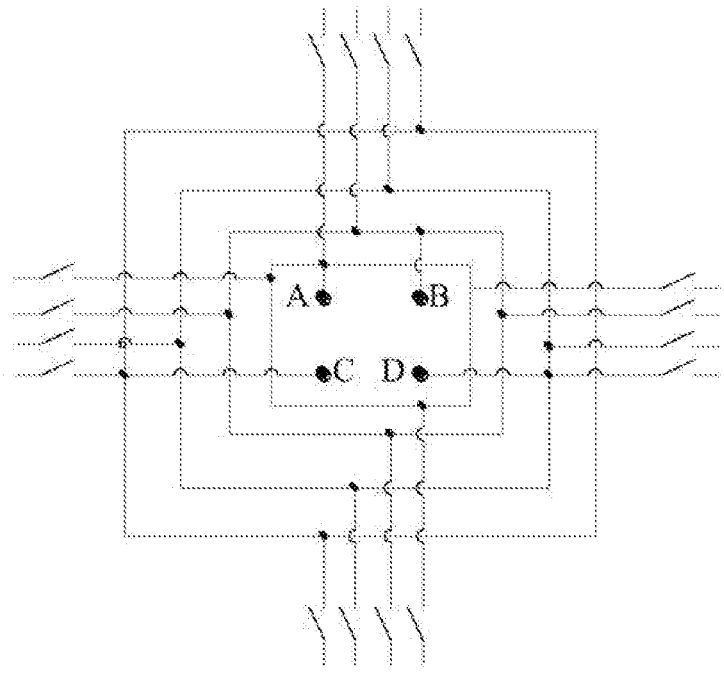
FIG. 8 is a schematic diagram of the connection relationship between the IO interface and the interconnection line in the second embodiment.

The Second Implementation Mode:

Referring to FIGS. 7 and 8, in addition to the storage circuit and the IO circuit, the basic storage module also includes a controllable interconnection line, which is different from the interconnection line shown in FIG. 3. In FIG. 7, the controllable interconnection line is shown by an arrow with a mark ⊗ which indicates a switch. That is, the on/off control of the interconnection line is realized by controlling the switch. The control terminal of the switch is led out from the IO interface of each storage module unit.

Figure 9:
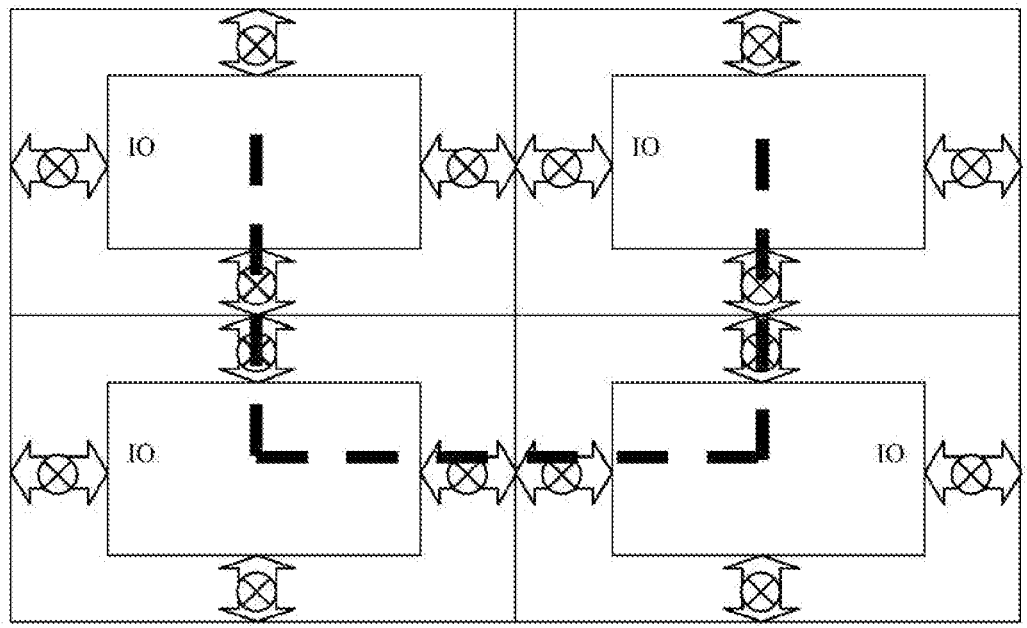
FIG. 9 is a schematic diagram of a 2×2 memory cell array according to a second embodiment.
Figure 10:
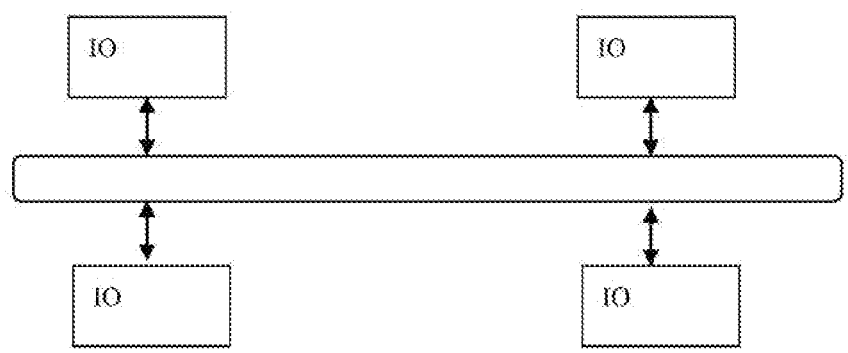
FIG. 10 is a schematic diagram of equivalent connection circuits between basic memory modules in the same chip.

FIG. 9 shows a 2×2 memory cell array. The switches of the controllable interconnection line excluding those indicated with bold dashed lines are turned off by configuring the interconnection control circuit. That is, the interconnection lines excluding those indicated with the bold dashed lines are inactivated, or so-called "disabled", which is equivalent to the connection construction shown in FIG. 10, where a bus-type connection is formed.

Figure 11:
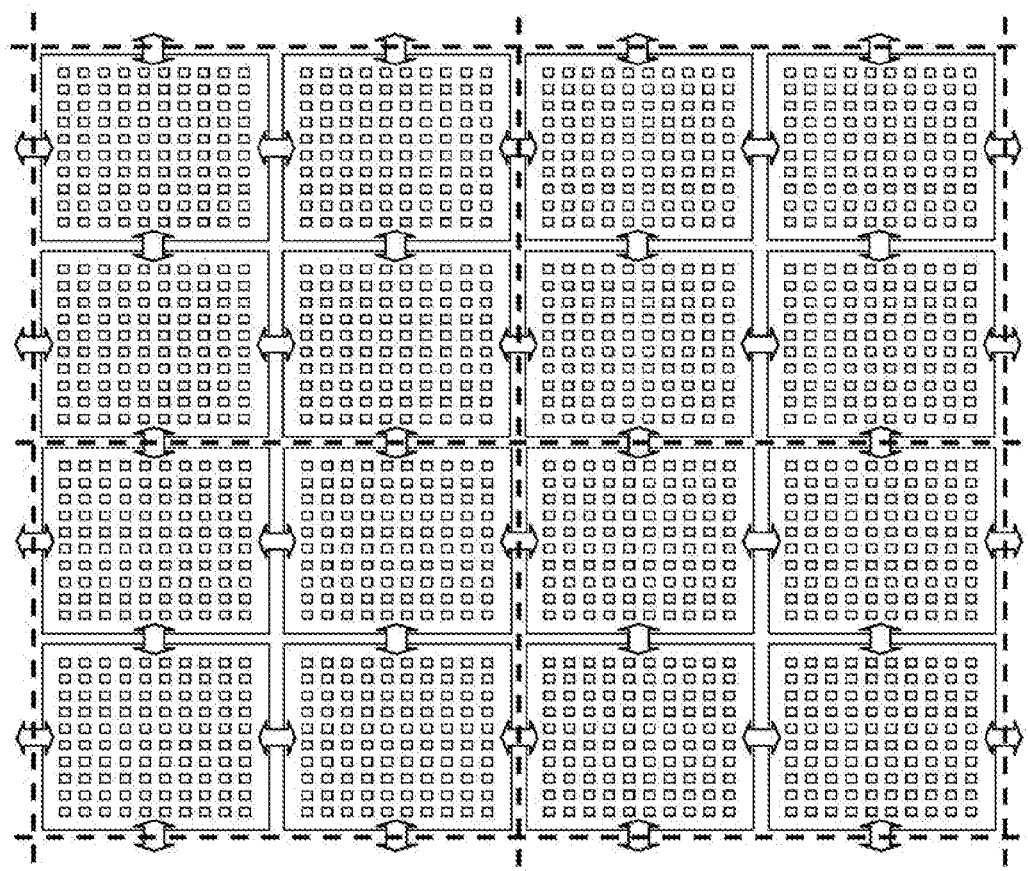
FIG. 11 is a schematic diagram of dicing area in the first embodiment.

Embodiment 1: See FIG. 11. The arrow in FIG. 11 is a simplified representation of the controllable interconnection line.

The semiconductor memory fabricating method of this embodiment comprises the following steps:

1) Using a semiconductor integrated circuit manufacturing process, basic memory module arrays are fabricated on a wafer. Each basic memory module includes an IO circuit and a memory circuit of a predetermined capacity connected to the IO circuit. FIG. 11 shows 4×4=16 memory cells, and the IO interfaces of the IO circuits of the memory cells adjacent in the orthogonal directions are connected by the controllable interconnection line;

2) The number of memory cells contained in the memory chip according to the predetermined memory capacity are determined, and then the memory chips are diced and separated.

3) Packaging the separated memory chip;

For example, in step 1), if the predetermined capacity of each basic memory module is 1G, to produce a chip with a capacity of 4G, dicing along the dashed line in FIG. 11 can form four 4G memory chips. After dicing, the interconnection lines at the edge of the chip are cut off. For those interconnection lines that are not necessary to lead out, the switch can be turned off through the switch control circuit (i.e., the interconnection control circuit) during configuration.

Further, the basic memory module of each minimum capacity unit can be written to with a unique address (as Chip ID) during testing or initialization (through NVM or OTP memory programming). The controllable interconnection line can be enabled (connected) or disabled (disconnected) during initialization. In addition to complete storage functions, each basic memory module also has complete bounding pads.

Figure 12:
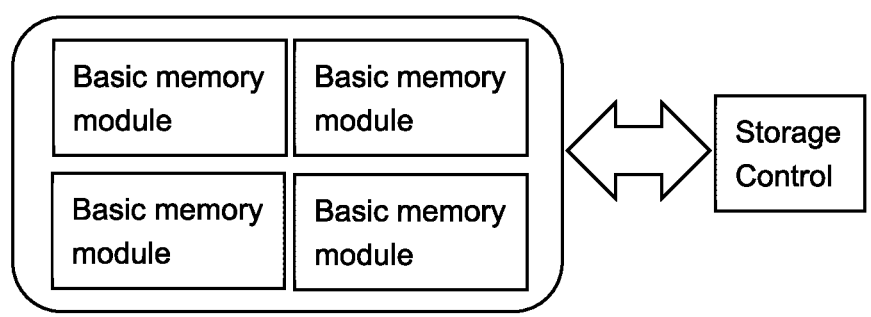
FIG. 12 is a schematic diagram of the chip structure of the present invention.

Referring to FIG. 12, the chip fabricated based on the technology of the present invention comprises at least two basic storage modules, and the IO interfaces of individual basic storage module form a bus connection through the interconnection line. After being packaged as a chip, the IO interface is connected to an external storage control circuit, and the external storage control circuit serves as a bus control circuit to perform functions, such as addressing.

Different from the prior art where "one mask set can only be used to manufacture memory chips with one specific capacity", the present invention only needs one mask or reticle set corresponding to a single basic memory module of a minimal memory capacity. By repeatedly use of the mask or reticle set, the module array can be made on the wafer. In the subsequent process, the group of memory modules is formed after dicing according to the required capacity. After the group of memory modules is packaged, it becomes a memory chip of the required capacity. The effect of "manufacturing memory chips of multiple different capacities with one mask or reticle set" is thus achieved. The invention establishes the interconnection between the basic storage modules at the wafer level, with the characteristics of high transmission speed and high reliability.

What is claimed is:

1. A method for fabricating a semiconductor memory, comprising the following steps:
    1) fabricating an array of basic memory modules on a wafer, wherein each basic memory module has a plurality of IO circuit interfaces, and the IO circuit interfaces of the basic memory modules adjacent in the orthogonal directions are connected via interconnection lines with each other;
    2) according to a predetermined memory capacity of each memory chip, determining the number of the basic memory modules contained in each memory chip and a position of an edge line of each memory chip, dicing the wafer along the edge line of the memory chip, and cutting off the interconnection lines across the edge line to obtain a plurality of memory chips;
    3) packaging the plurality of memory chips.

2. The method of fabricating the semiconductor memory according to claim 1, further comprising the following step:
    writing identification information of a memory unit to a data storage area of each basic storage module.

3. The method for fabricating the semiconductor memory according to claim 1, wherein in step 1), a switch is provided on each interconnection line;
    after step 2), the following step is included: a state of each switch is initialized according to preset.

4. The method for fabricating the semiconductor memory according to claim 1, wherein step 2) further comprises the following sub-step: setting the switch in each interconnection line at the edge line of the memory chip to an off state.

5. The method for fabricating the semiconductor memory according to claim 1, wherein each IO circuit interface comprises at least one of the following types: data lines, control lines, and address lines.

6. A semiconductor memory fabricated by the method of fabricating the semiconductor memory according to claim 1.

7. A semiconductor memory fabricated by the method of fabricating the semiconductor memory according to claim 2.

8. A semiconductor memory fabricated by the method of fabricating the semiconductor memory according to claim 3.

9. A semiconductor memory fabricated by the method of fabricating the semiconductor memory according to claim 4.

10. A semiconductor memory fabricated by the method of fabricating the semiconductor memory according to claim 5.

* * * * *